United States Patent [19]

Motonami et al.

[11] Patent Number: 5,309,023
[45] Date of Patent: May 3, 1994

[54] CONTACT STRUCTURE FOR INTERCONNECTION IN SEMICONDUCTOR DEVICES AND MANUFACTURING METHOD THEREOF

[75] Inventors: Kaoru Motonami; Katumi Suizu, both of Hyogo, Japan

[73] Assignee: Mitsubishi Denki Kabushiki Kaisha, Tokyo, Japan

[21] Appl. No.: 888,323

[22] Filed: May 26, 1992

Related U.S. Application Data

[63] Continuation of Ser. No. 609,561, Nov. 6, 1990, abandoned.

[30] Foreign Application Priority Data

Nov. 14, 1989 [JP] Japan .................................. 1-296832
Oct. 4, 1990 [JP] Japan .................................. 2-268230

[51] Int. Cl.$^5$ ..................... H01L 23/48; H01L 21/44
[52] U.S. Cl. ..................... 257/773; 257/774; 257/740; 257/750; 257/751; 257/754; 437/189; 437/190; 437/203
[58] Field of Search ............... 357/68, 55, 71; 437/189, 190, 203

[56] References Cited

U.S. PATENT DOCUMENTS

| | | | |
|---|---|---|---|
| 4,507,853 | 4/1985 | McDavid | 357/68 |
| 4,967,254 | 10/1990 | Shimura | 357/68 |
| 4,967,259 | 10/1990 | Takagi | 357/68 |

OTHER PUBLICATIONS

IBM Tech. Bul.-vol. 30, No. 8, Jan. 1988, pp. 295-296.

Ito-Patent Abstracts of Japan, E-881, Jan. 1990 vol. 14, No. 51.

*Primary Examiner*—Edward Wojciechowicz
*Attorney, Agent, or Firm*—Lowe, Price, LeBlanc & Becker

[57] ABSTRACT

A contact structure for interconnection in semiconductor devices provides electrical contact between an impurity-diffused region formed in a silicon substrate and a polycrystalline silicon layer through a contact hole. The contact structure for interconnection comprises the silicon substrate, the impurity-diffused region, an insulating oxide film, the interconnection layer formed of a polycrystalline silicon layer containing impurities. The impurity-diffused region is formed in a main surface of the silicon substrate as a source/drain region of an MOS transistor. The insulating oxide film has a contact hole formed therethrough to reach a surface of this impurity-diffused region. A sidewall layer of polycrystalline silicon is formed on the bottom peripheral edge of the contact hole. The interconnection layer is formed on the sidewall layer of polycrystalline silicon and over the insulating oxide film to get contact with the surface of the impurity-diffused region exposed by the contact hole. When the impurities are thermally diffused to make electrical contact between the polycrystalline silicon layer constituting the interconnection layer and the impurity-diffused region, the size of the impurity-diffused region for contact can be controlled such that it does not become larger than that of the contact hole. Thus, the impurity-diffused region for contact can be prevented from adversely affecting characteristics of the MOS transistor.

23 Claims, 13 Drawing Sheets

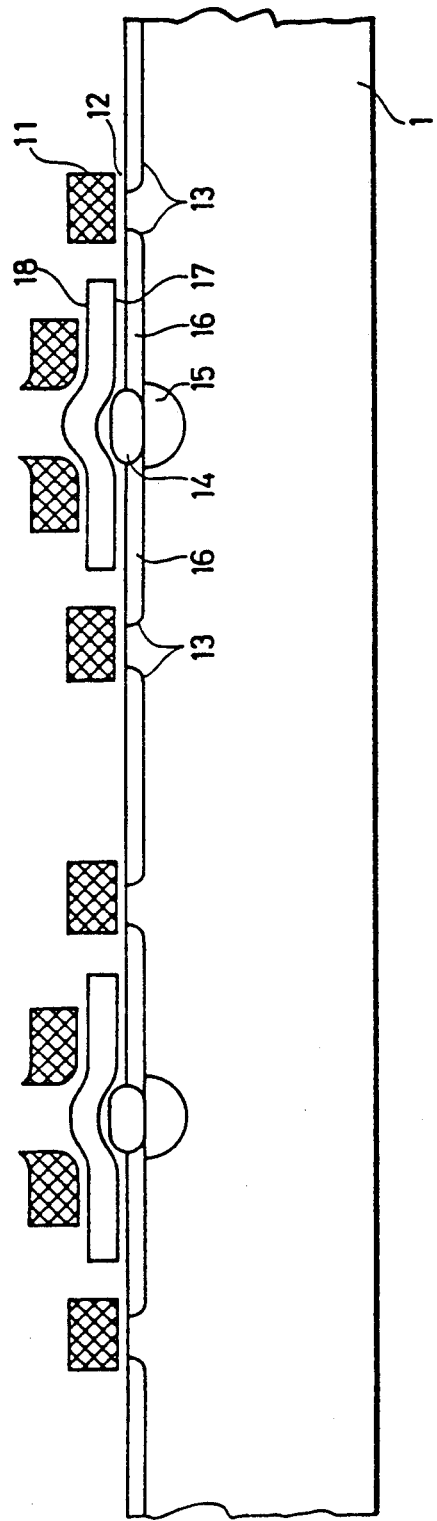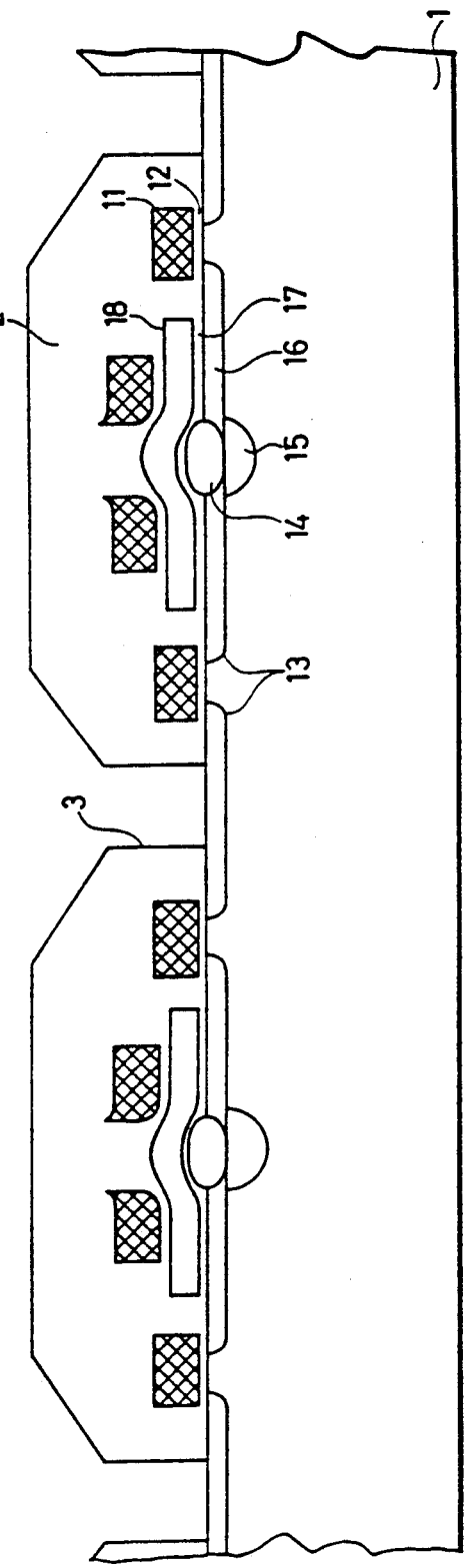

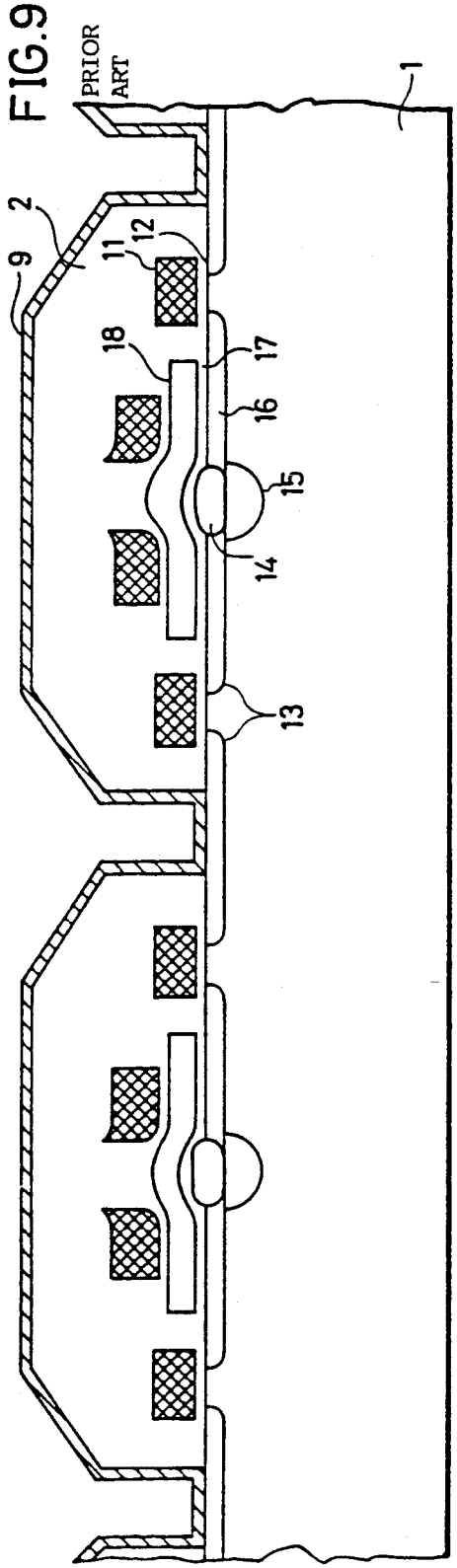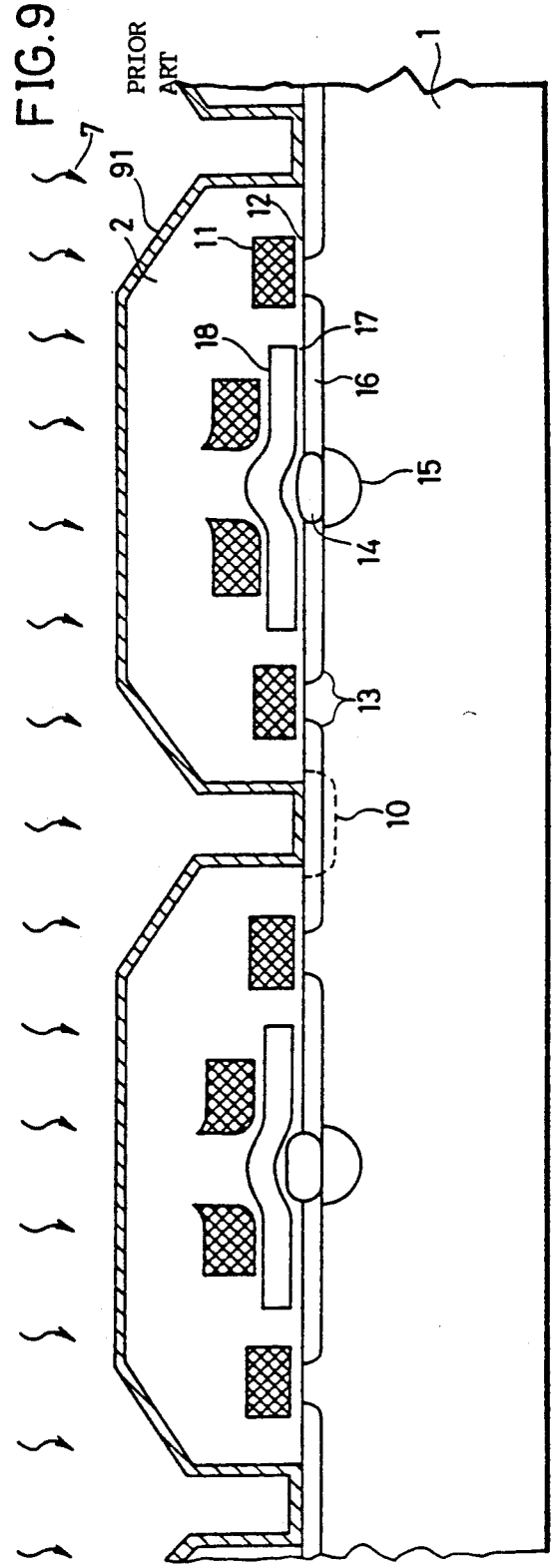

CONTACT STRUCTURE FOR INTERCONNECTION IN SEMICONDUCTOR DEVICES AND MANUFACTURING METHOD THEREOF

This application is a continuation of application Ser. No. 07/609,561 filed Nov. 6, 1990, now abandoned.

BACKGROUND OF THE INVENTION

1. Field of the Invention

The present invention generally relates to contact structure for interconnection in semiconductor devices and manufacturing methods thereof. More particularly, the present invention relates to improvements in a contact structure for interconnection in semiconductor integrated circuit devices which provides through a contact hole electrical contact between an interconnection layer and a conductive region formed in a semiconductor substrate, and in a manufacturing method thereof.

2. Description of the Background Art

FIGS. 9A to 9F are fragmentary sectional views showing in particular a method of forming a contact structure for interconnection in a conventional manufacturing method of semiconductor devices, along its process flow. FIG. 10A is a plan view corresponding to FIG. 9B, which shows a sectional view along IX—IX in FIG. 10A. FIG. 10B is a plan view corresponding to FIG. 9E which shows a sectional view along IX—IX in FIG. 10B. Referring to these diagrams, a conventional method of forming a contact structure for interconnection in semiconductor devices will be described. Now, a dynamic random access memory (DRAM) having a planar capacitor structure will be taken as an example of semiconductor devices in describing a method of forming a contact structure for interconnection therein.

First, referring to FIG. 9A, a p-type impurity-diffused region 15 for preventing inversion and a thick isolating oxide film 14 are formed by thermally oxidizing a p-type silicon substrate 1 which has had p-type impurity ions selectively implanted therein. N-type impurity ions are then implanted by ion implantation method or the like, and a heat treatment is applied to form an n-type impurity-diffused region 16. Thereafter, a thin capacitor gate insulating film 17 is formed by thermal oxidation or chemical vapor deposition (CVD) method. Over this capacitor gate insulating film 17, a polycrystalline silicon layer containing impurities of a predetermined conductivity-type is deposited by CVD method or the like, and selectively removed by photolithography to form a cell plate 18. Thus, a capacitor comprised of n-type impurity-diffused region 16 and cell plate 18 is formed.

A gate oxide film 12 is formed on p-type silicon substrate 1 by thermal oxidation or the like. A polycrystalline silicon monolayer film or a two-layer film of polycrystalline silicon and metal silicide having a high melting point is deposited on gate oxide film 12 by CVD method or the like. Thereafter, those films are selectively removed by photolithography or the like, leaving gate electrodes 11 formed apart from each other. Phosphorus ions, n-type impurities are implanted into silicon substrate 1 by ion implantation method or the like, using gate electrodes 11 and cell plates 18 as mask. Thereafter, n-type impurity-diffused regions 13 are formed as source/drain regions of MOS transistors by application of a thermal treatment. At this time, one of paired n-type impurity-diffused regions 13 is formed to be connected to n-type impurity-diffused region 16 constituting a capacitor.

Subsequently, referring to FIG. 9B, an insulating oxide film 2 is deposited over the entire surface of the substrate by low pressure CVD or the like, and then selectively removed by photolithography, forming a contact hole 3. This contact hole 3 is formed by selectively etching away insulating oxide film 2 with selective etching technique including isotropic wet etching and anisotropic reactive ion etching (RIE), using a predetermined resist pattern formed thereon as mask. FIG. 10A is a plan view showing arrangement of thus formed contact holes 3.

As shown in FIG. 9C, undoped polycrystalline silicon film 9 is deposited by low pressure CVD method to have a thickness of 1000 to 1500 Å on exposed surfaces of impurity-diffused regions 13, or drain/source regions, and over insulating oxide film 2.

As shown in FIG. 9D, in order to reduce resistance of this undoped polycrystalline silicon film 9, phosphorous of n-type impurity is thermally diffused into the surface of undoped polycrystalline silicon film 9 in the direction indicated by arrow 7. At this time, the thermal diffusion is carried out at a temperature of 900° C. such that polycrystalline silicon film 91 has an impurity concentration of about $10^{22}/cm^3$. At the same time, an impurity-diffused region 10 is formed also in silicon substrate 1 through polycrystalline silicon film 91 to get contact with an impurity diffused region 13. In this manner, electrical contact is made between polycrystalline silicon film 91 which contains impurities and serves as an interconnection layer and the impurity-diffused region 13, or source/drain region, through impurity-diffused region 10.

Meanwhile, in the step shown in FIG. 9C, a doped polycrystalline silicon film may be formed. In this case, the thermal diffusion for the polycrystalline silicon film containing n-type impurities as shown in FIG. 9D is not carried out. The impurities with which the polycrystalline silicon film is doped are thermally diffused in a heat treatment applied in a later step so that impurity-diffused region 10 for taking contact with an impurity-diffused region 13 is formed.

Referring to FIG. 9E, a metal silicide film 92 having a high melting point is formed on polycrystalline silicon film 91. In this manner, a bit line constituted of polycrystalline silicon film 91 and metal silicide film 92 of a high melting point is connected to the other impurity-diffused region 13. Thereafter, a thick interlayer insulating film 20 is formed. A plan view showing arrangement of bit lines is given by FIG. 10B.

Referring to FIG. 9F, an aluminum layer is deposited over interlayer insulating film 20 by sputtering. Thereafter, the aluminum layer is patterned by photolithography such that an aluminum interconnection layer 50 is formed to serve as auxiliary word lines which extend in the direction parallel to gate electrodes 11 serving as word lines.

In the conventional contact structure for interconnection, however, the thermal diffusion of impurities from the polycrystalline silicon film entails undesirably extensive diffusion into the silicon substrate, especially in a lateral direction. In FIG. 9F, for example, when the thermal diffusion of impurities is carried out under such conditions as described above, impurity-diffused region 10 for contact acquires a dimension with 11 of about 0.2 μm and d of about 0.5 μm. Thus, the lateral length of impurity-diffused region 10 may possibly exceed the diameter of a contact hole. This has emerged as a significant problem for the increasingly miniaturized semiconductor devices of recent years. That is, in FIG. 9F, as the semiconductor device is miniaturized, the distance between gate electrodes 11 is diminished so that the distance ;2 between a sidewall surface of insulating oxide film 2 which defines dimension of the contact hole and a sidewall surface of a gate electrode 11 is reduced to about 0.5 μm. Accordingly, the lateral extension 11 of impurity-diffused region 10 for contact may adversely affect an impurity-diffused region 13 serving as a source/drain region of an MOS transistor. As a result, it becomes difficult to secure a marginal region which is necessary to maintain specific characteristics of the MOS transistor.

The above-mentioned problem concerning the difficulty of securing a marginal region is understandable especially in the case that errors have occured in the patterning for forming contact holes. FIG. 11 shows a sectional view of a contact structure for interconnection where no error has occurred in the patterning for forming contact holes, and a diagram showing distribution of impurity concentrations corresponding to the sectional view. FIG. 12 shows a sectional view of a contact structure for interconnection where errors have occurred in the patterning for forming contact holes, and a diagram showing distribution of impurity concentrations corresponding the sectional view. Referring to those diagrams, problems that arise when errors have occurred in the patterning will be described below.

As shown in FIG. 11, gate electrode 111 is formed on p-type silicon substrate 1 with gate oxide film 112 interposed therebetween. On a sidewall of gate electrode 111, there is formed sidewall insulating film 210 Impurity-diffused region 213 having a low concentration of no more than $10^{19}$/cm is formed in silicon substrate 1 beneath sidewall insulating film 210. Another impurity-diffused region 113 having a high concentration of about $10^{20}$/cm is formed to be connected to impurity-diffused region 213 of a low concentration. Such a structure of impurity-diffused regions is called LDD (Lightly Doped Drain) structure. This LDD structure is adopted to reduce field strength in the vicinity of drain of an MOS transistor. Polycrystalline silicon film 109 containing impurities is formed to get contact with impurity-diffused region 113 of a high concentration through a contact hole 103. Electrical contact between polycrystalline silicon film 109 and impurity-diffused region 113 is made in impurity-diffused region 10 provided for contact.

In this case, since no error has occurred in the patterning by photolithography, impurity-diffused region 10 for contact lies within impurity-diffused region 113 of a high concentration. Therefore, as shown in the distribution diagram of impurity concentrations in FIG. 11, the formation of impurity-diffused region 10 for contact does not affect changes of impurity concentrations in the channel region of an MOS transistor and in its vicinity. As a result, the gradual change of impurity concentrations in the channel region of the MOS transistor and in its vicinity can be maintained. Thus, the existence of impurity-diffused region 10 does not prevent the LDD structure from reducing field strength of the MOS transistor.

However, in the case that errors have occurred in the patterning as shown in FIG. 12, impurity-diffused region 10 for contact may be formed to overlap impurity-diffused region 213 of a low concentration. In this case, impurity concentrations in the channel region of the MOS transistor and in its vicinity change sharply due to the existence of impurity-diffused region 10. As a result, the LDD structure can not exercise its effects in reducing field strength of the MOS transistor. In this manner, the lateral extension of impurity-diffused region 10 adversely affects a source/drain region of the MOS transistor, preventing the MOS transistor from maintaining its own characteristics.

While in the foregoing, description has been made on the case that the interconnection layer is formed of polycrystalline silicon film 109 containing impurities, problems as will be described below arise also in the case that the interconnection layer is formed of a high melting point metal, for example, a metal layer containing tungsten. FIG. 13 is a sectional view showing a contact structure for interconnection where errors have occurred in the patterning for forming contact holes. The interconnection layer is formed of a metal layer 191 containing a high melting point metal such as titanium and tungsten. In this case, high melting point metal layer 191 is formed to directly contact a surface 103a of impurity-diffused region 213 having a low concentration, due to the patterning errors. At this time, the high melting point metal contained in high melting point metal layer 191 is silicidized on the surface 103a of silicon substrate 1. This silicidization is more likely to occur especially when the impurity-diffused region in contact with high melting point metal layer 191 has a low impurity concentration. When the silicidization occurs, problems such as an increase in electrical resistance of the contact portion and breakdown of a junction in the impurity-diffused region arise. Thus, even when the interconnection layer is formed of a high melting point metal layer, the problems as described above occur due to errors made in the patterning.

SUMMARY OF THE INVENTION

An object of the present invention is to form a contact structure for interconnection such that an interconnection layer does not deteriorate characteristics of a conductive region in a contact portion with the interconnection layer.

Another object of the present invention is to apply a contact structure for interconnection to a miniaturized semiconductor device.

Still another object of the present invention is to control size of an impurity-diffused region, which provides electrical contact between a conductive region formed in a semiconductor substrate and an interconnection layer, such that it does not exceed size of a contact hole in a contact structure for interconnection.

A further object of the present invention is to restrain around the bottom periphery of a contact hole reaction between a conductive region formed in a semiconductor substrate and a high melting point metal contained in an interconnection layer in a contact structure for interconnection.

A still further object of the present invention is to form a contact structure for interconnection in which characteristics of a conductive region are not deteriorated even when errors have occurred in the patterning for forming contact hole.

A contact structure for interconnection in semiconductor devices according to one aspect of the present invention provides electrical contact between a conductive region formed in a semiconductor substrate and an interconnection layer through a contact hole and comprises the semiconductor substrate, the conductive region, an insulating layer, the interconnection layer and means for restraining interaction. The semiconductor substrate has a main surface. The conductive region is formed in the semiconductor substrate. The insulating layer is formed on the main surface of the semiconductor substrate and has a contact hole formed therethrough to reach a surface of the conductive region. The interconnection layer containing a high melting point material as a main material is formed on the surface of the conductive region and over the insulating layer. The means for restrainig interaction restrains interaction between the interconnection layer and the conductive region from extending laterally in the semiconductor substrate.

In a manufacturing method of the contact structure for interconnection according to another aspect of the present invention, a conductive region is first formed in a semiconductor substrate. An insulating layer is formed on a main surface of the semiconductor substrate. The insulating layer has a contact hole formed therethrough to reach a surface of the conductive region. An interconnection layer containing a high melting point material as a main material is formed on the surface of the conductive region and over the insulating layer. Further, means for restraining interconnection between the interconnection layer and the conductive region from laterally extending in the semiconductor substrate is formed.

Meanwhile, the high melting point material comprised in the interconnection layer has a melting point of no less than 700° C.

According to the present invention, lateral extention of the interaction between the interconnection layer and the conductive region in the semiconductor substrate is restrained. Therefore, even when impurities contained in the interconnection layer are thermally diffused in the heat treatment and the like, the impurities can not be diffused laterally in the semiconductor substrate to such an extent as adversely affecting characteristics of the conductive region. In addition, the high melting point metal comprised in the interconnection layer can not react on the semiconductor substrate in a contact portion with the conductive region to such an extent as deteriorating characteristics of the conductive region. Accordingly, in a miniaturized semiconductor device, characteristics of a transistor or the like which has a conductive region in electrical contact with the interconnection layer can not be adversely affected.

According to a preferred embodiment of the contact structure for interconnection of the present invention, the interconnection layer contains at least silicon and impurities of a predetermined conductivity-type. Further, the interconnection layer comprises a high melting point metal. In order to restrain interaction between the interconnection layer and a conductive region from extending laterally in the semiconductor substrate, the interconnection layer is formed with a region comprising a material of a greater resistance to the interaction than the interconnection layer. Further, in order to restrict the interaction, the interconnection layer has a region comprising an electrically insulating material. Furthermore, a sidewall layer is formed on the bottom periphery of a contact hole so as to restrain the interaction.

According to a preferred embodiment of the manufacturing method of the contact structure for interconnection of the present invention, the step of forming the sidewall layer described above includes the steps of forming a deposited layer on a surface of the conductive region and over the insulating layer which contains at least silicon, and leaving part of the deposited layer around the bottom periphery of the contact hole by anisotropic etching.

As described above, according to the present invention, lateral extension of the interaction between the interconnection layer having a high melting point material as a main material and the conductive region formed in the semiconductor substrate can be restrained. Therefore, when the interconnection layer is comprised of polycrystalline silicon which contains impurities, thermal diffusion of the impurities can be controlled such that it does not extend laterally outside a contact hole. Accordingly, the size of an impurity-diffused region, which is formed in the semiconductor substrate to provide electrical contact between the interconnection layer of polycrystalline silicon and the conductive region, can be controlled such that it does not exceed the size of a contact hole. Further, when the interconnection layer is comprised of a metal layer containing a high melting point metal, the interaction between the high melting point metal contained in the interconnection layer and the conductive region can be restrained from extending laterally in the semiconductor substrate.

Accordingly, even when errors have occurred in the patterning for forming contact holes, lateral extension of the interaction between the interconnection layer and the conductive region can be restrained. Therefore, it can be effectively prevented that characteristics of semiconductor devices such as transistor are adversely affected by the interconnection layer.

The foregoing and other objects, features, aspects and advantages of the present invention will become more apparent from the following detailed description of the present invention when taken in conjunction with the accompanying drawings

BRIEF DESCRIPTION OF THE DRAWINGS

FIGS. 9A, 9B, 9C, 9D, 9E and 9F are fragmentary sectional views showing a manufacturing method of a conventional contact structure for interconnection in semiconductor devices, along its process flow.

DESCRIPTION OF THE PREFERRED EMBODIMENTS

Figure 4:
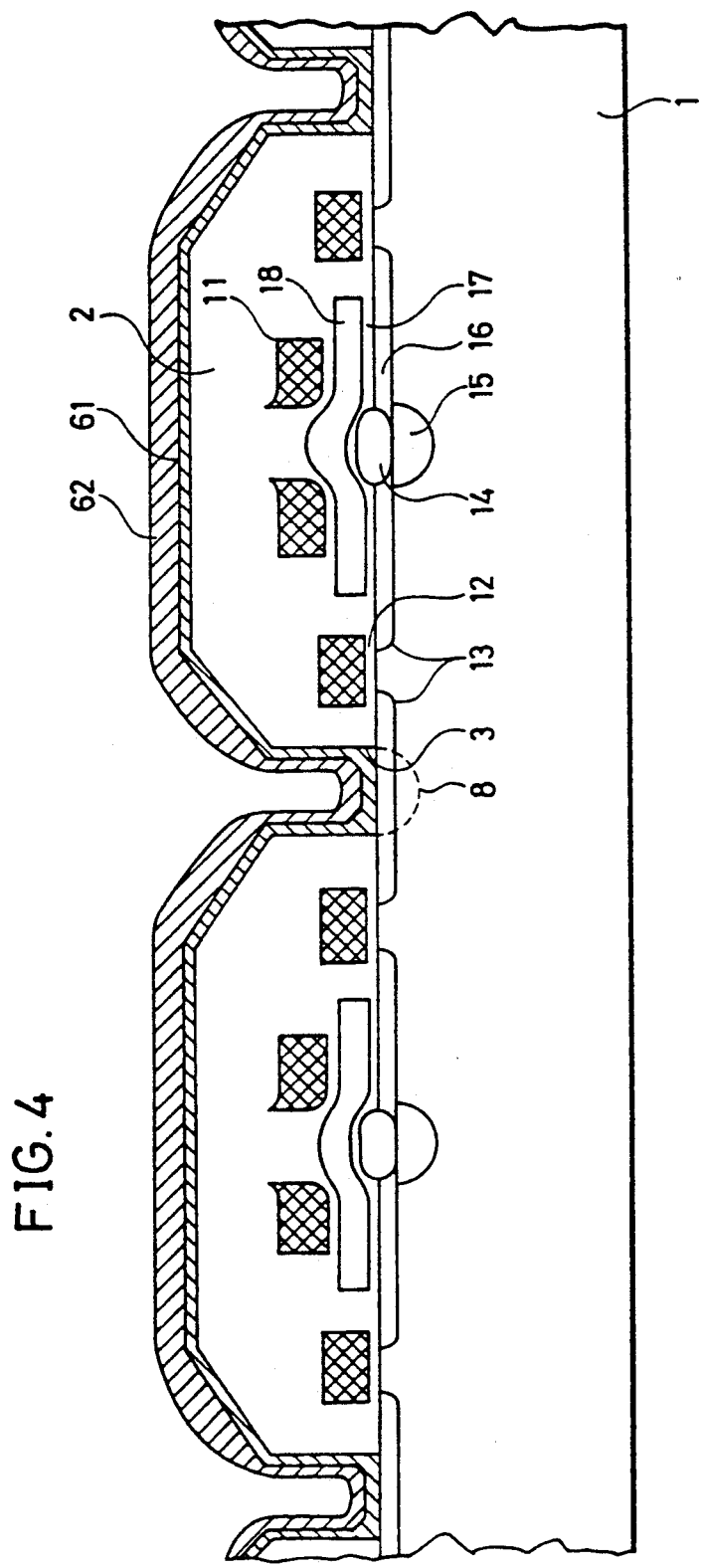
FIG. 4 is a fragmentary sectional view of a dynamic random access memory, an example of semiconductor devices to which the contact structure for interconnection of the present invention is applied.

In the following, description will be made on an embodiment where the contact structure for interconnection according to the present invention is applied to a dynamic random access memory (DRAM) of planar capacitor structure, which is taken as an example of semiconductor devices. FIG. 4 is a fragmentary sectional view showing an example of semiconductor memory devices to which the contact structure for interconnection of the present invention is applied. FIGS. 1A to 1E are fragmentary sectional views showing in particular a method of forming a contact region in the contact structure for interconnection shown in FIG. 4, along its process flow.

Figure 1A:
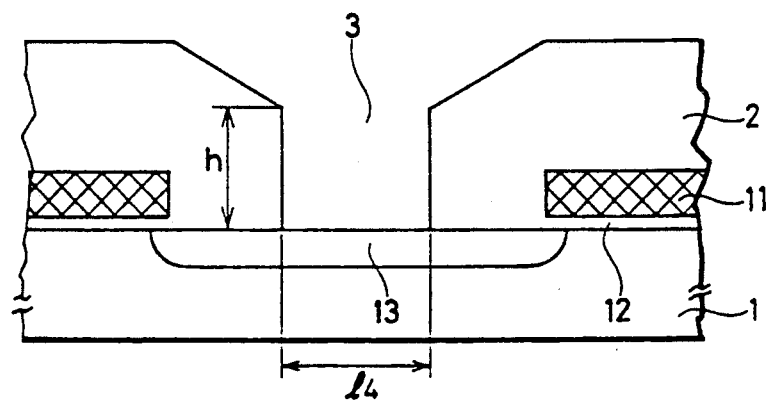
FIGS. 1A, 1B, 1C, 1D and 1E are fragmentary sectional views showing an embodiment of the manufacturing method of the contact structure for interconnection in semiconductor devices of the present invention, along its process flow.

First, referring to FIG. 1A, a gate oxide film 12 is formed on a p-type silicon substrate 1 by thermal oxidation or the like. A monolayer film of polycrystalline silicon or a two-layer film of polycrystalline silicon and metal silicide having a high melting point is deposited on gate oxide film 12 by CVD or the like, and selectively removed by photolithography, leaving gate electrodes 11 formed apart from each other. Thereafter, phosphorus ions are implanted as n-type impurities in silicon substrate 1 between gate electrodes 11 by ion implantation method or the like. Thereafter, an n-type impurity-diffused region 13 is formed as a source/drain region of an MOS transistor. An insulating oxide film 2 is then deposited over the entire surface of the substrate by low pressure CVD. Subsequently, after a predetermined photoresist pattern is formed on insulating oxide film 2, selective etching including isotropic wet etching and anisotropic RIE is applied to form a contact hole 3 with a tapered portion. At this time, outside diameter 14 of the contact hole is, for example, about 1μm and its aspect ratio (h/14) is no less than 1.

Figure 1B:
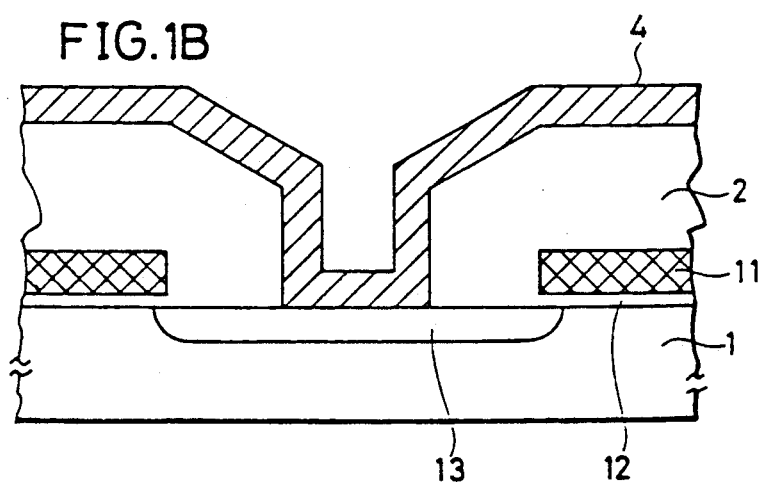

Next, referring to FIG. 1B, an undoped polycrystalline silicon film 4 is deposited to 1500 to 2000 Å on an exposed surface of impurity-diffused region 13 in silicon substrate 1 and over insulating oxide film 2. The formation of polycrystalline silicon film 4 is carried out by low pressure CVD.

Figure 1C:
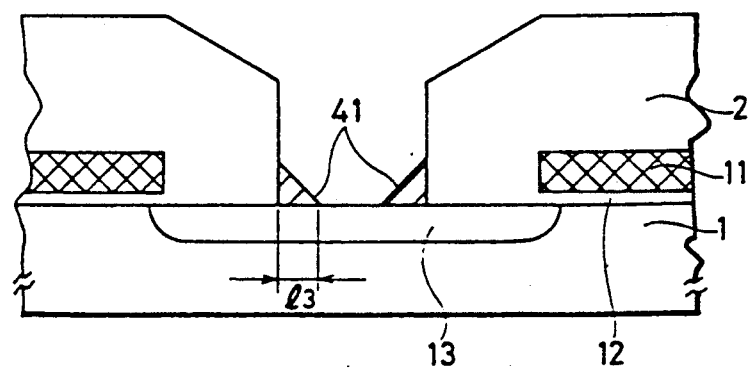

Referring to FIG. 1C, the entire surface of polycrystalline silicon film 4 is uniformly etched using an anisotropic etching technique with a high selectivity, such as reactive ion etching (RIE). For example, etching conditions in this case will be as follows. That is, for polycrystalline silicon film 4 of a 2000 Å thickness, the etching gas is a mixed gas of $SF_6$ and $Cl_2$, the etching rate is about 3000 Å/min, and the selectivity ratio of the polycrystalline silicon film to the silicon oxide film is 80 to 1. Thus, as a result of the application of highly anisotropic etching, a sidewall layer 41 of polycrystalline silicon is left on the bottom peripheral edge of the contact hole. In this case, the distance 13, as shown in FIG. 1C, from a sidewall surface of insulating oxide film 2 which defines dimension of the contact hole, to an edge of sidewall layer 41 of polycrystalline silicon is about 1500 to 2000 Å.

Figure 1D:
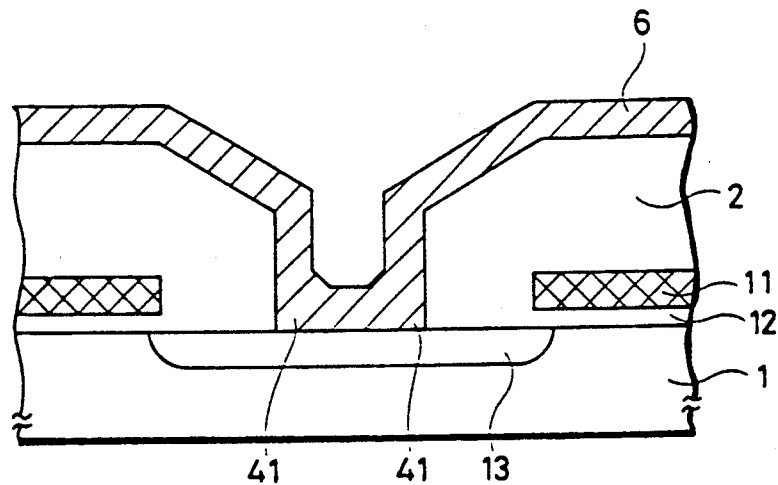

The etching step of the polycrystalline silicon film as described above is shown in further detail in FIGS. 3A to 3D. In this case, polycrystalline silicon film 40 of a 2000 Å thickness is formed on insulating oxide film 2. The vertical depth h of the contact hole is 1 μm. Etching conditions are the same as those described above. As shown in these diagrams, polycrystalline silicon film 40 is etched away by an anisotropic etching with a high selectivity so as to leave first sidewall layer 40a, then 40b, and eventually 40c of polycrystalline silicon, around the bottom peripheral edge of the contact hole. Thereafter, as shown in FIG. 1D, an undoped polycrystalline silicon film 6 of about 1000 to 1500 Å thickness is deposited on sidewall layer 41 of polycrystalline silicon and the exposed surface of impurity-diffused region 13 and over insulating oxide film 2 again by low pressure CVD method. At this time, sidewall layer 41 of polycrystalline silicon is integrated with the undoped polycrystalline silicon layer 6.

Figure 1E:
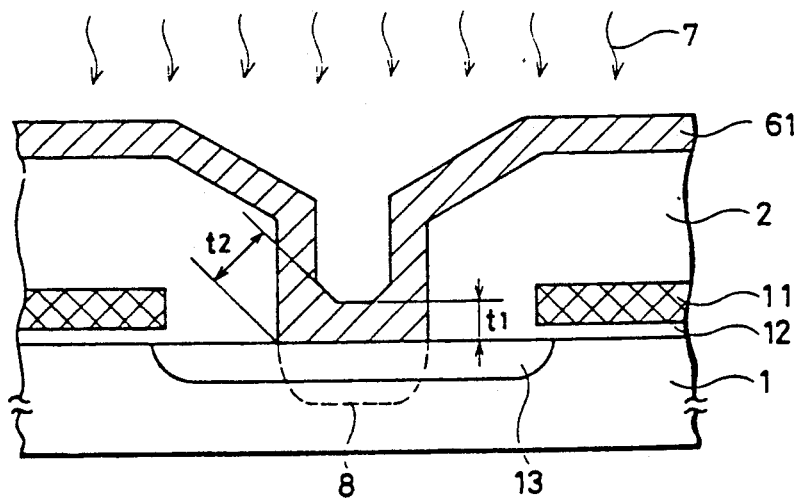
Figure 9E:
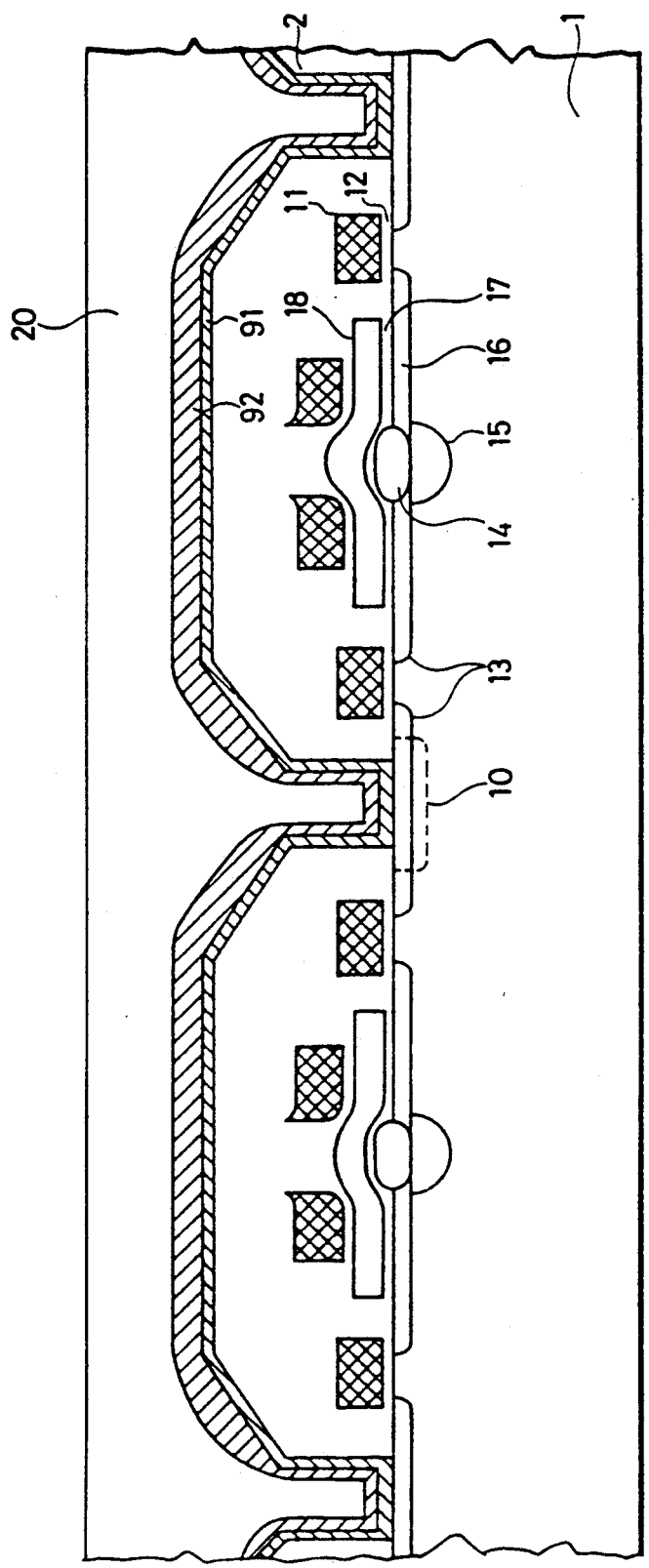
Figure 9F:
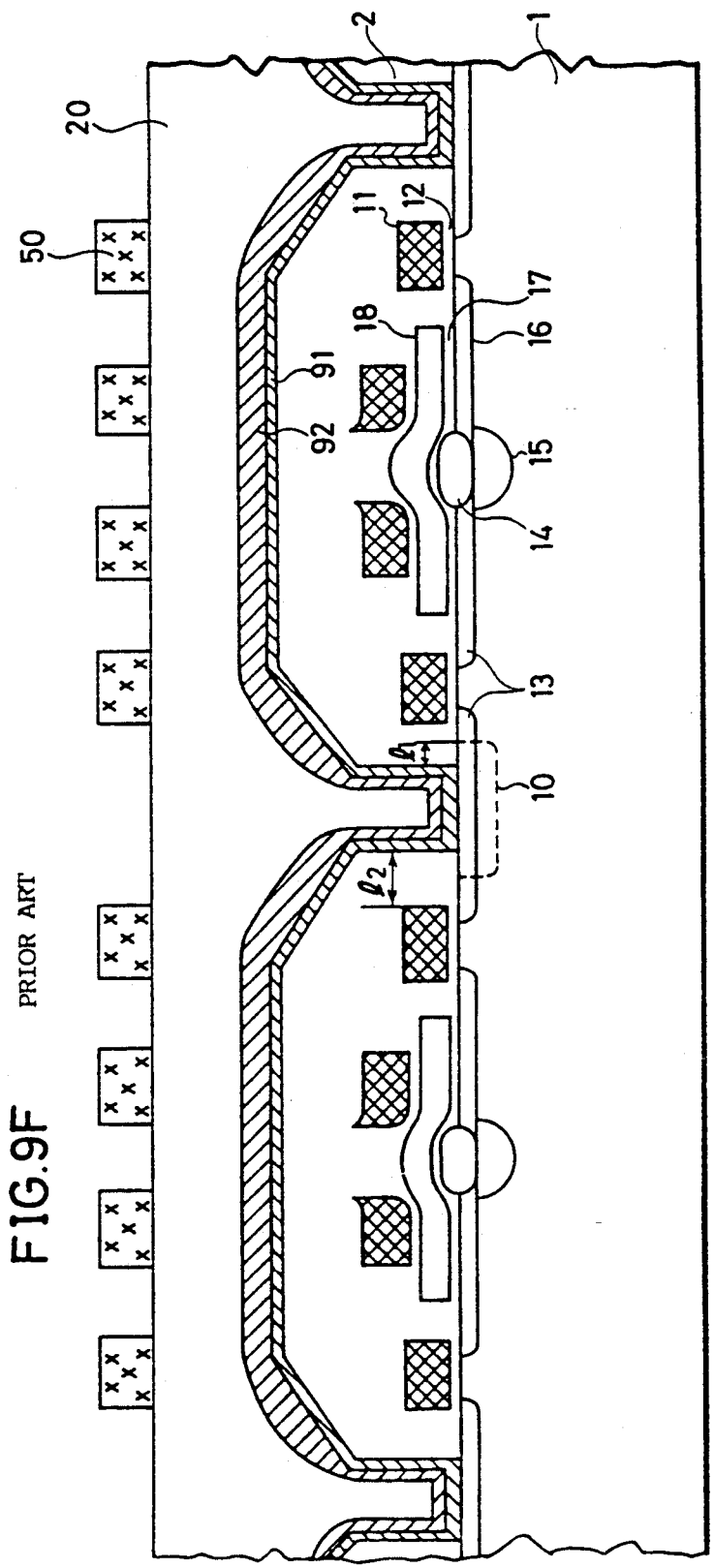
Figure 10A:
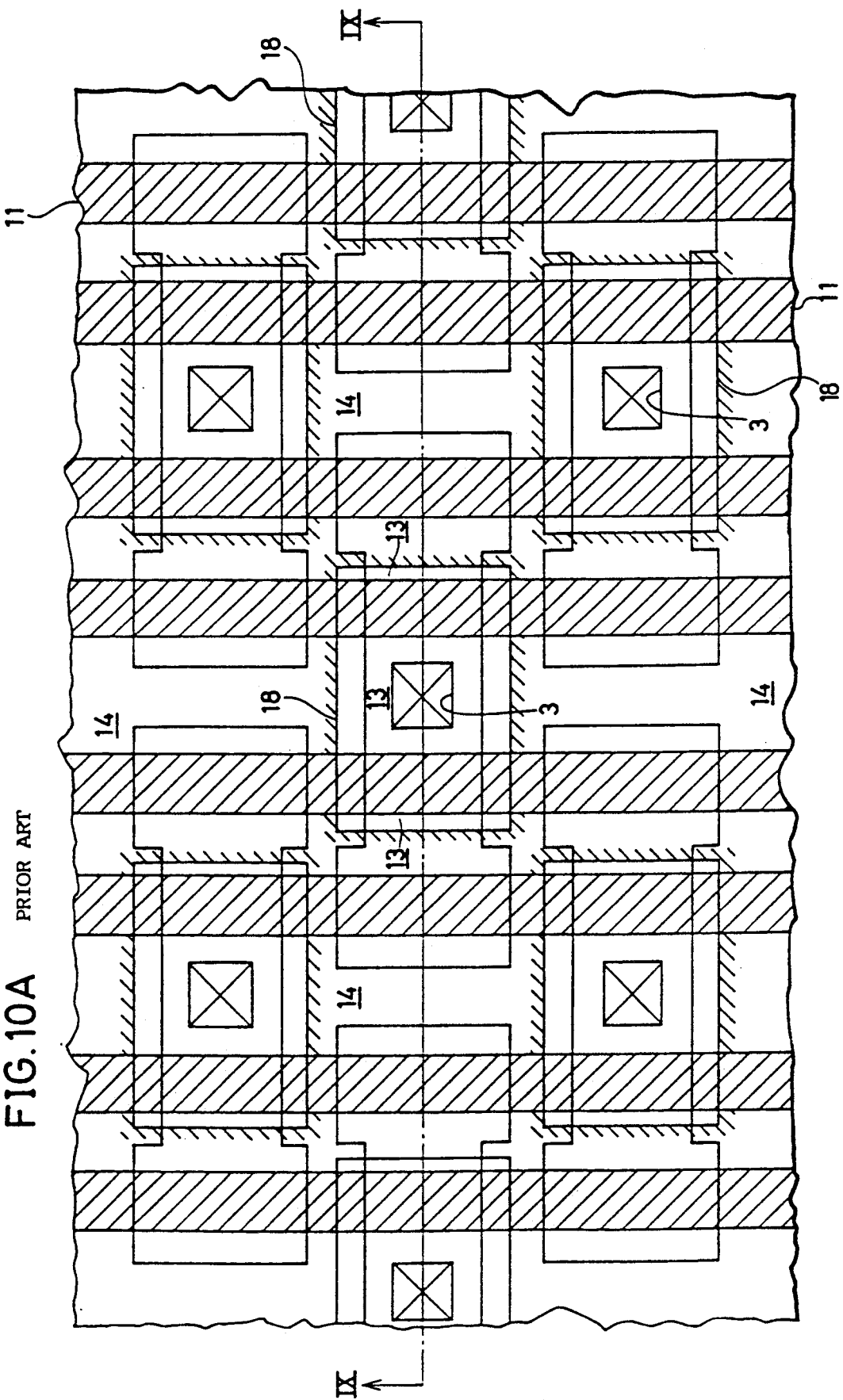
FIGS. 10A and 10B are plan views corresponding to FIGS. 9B and 9E, respectively.
Figure 10B:
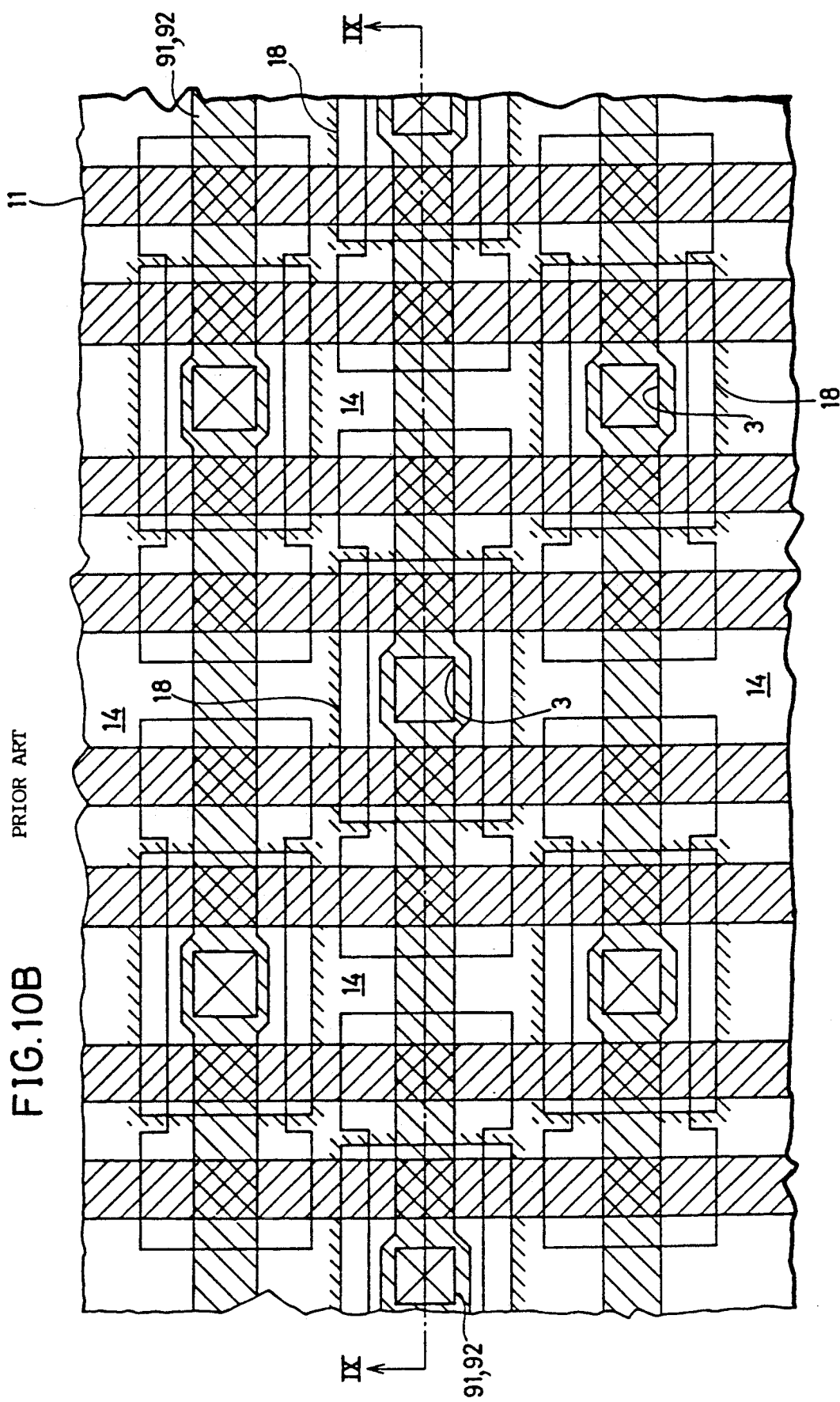

Referring to FIG. 1E, phosphorus is thermally diffused as impurities into polycrystalline silicon film 6 in the direction indicated by arrow 7 so as to reduce its resistance. The thermal diffusion is carried out at 900° C. so as to attain an impurity concentration of about $10^{22}/cm^3$ in polycrystalline silicon film 61. The phosphorus is thermally diffused also in sidewall layer 41 of polycrystalline silicon. At the same time, an impurity-diffused region 8 for contact is formed in silicon substrate 1. The existence of previously formed sidewall layer 41 of polycrystalline silicon ensures t2>t1=1000 to 1500 Å in FIG. 1E. Accordingly, even when the impurities are thermally diffused from the surface of polycrystalline silicon film 6, the impurity-diffused region can not be formed in silicon substrate 1 as extending laterally outside the bottom peripheral edge of the contact hole. That is, 11 shown in FIG. 9F can be limited to about ±0.1 μm. This is because the thermal diffusion of impurities can not extend over the distance t2.

In this manner, impurity-diffused region 8 for contact which does not adversely affect impurity-diffused region 13, or a source/drain region is formed. Therefore, a marginal region can be secured between MOS transistors.

While in the embodiment above, description has been made on a case that undoped polycrystalline silicon film 6 is formed in the step shown in FIG. 1D, a polycrystalline silicon film which has been doped with impurities in advance may be formed. In such a case, the thermal diffusion of impurities as shown in FIG. 1E is not carried out. The impurities with which the polycrystalline silicon film has been doped are thermally diffused in silicon substrate 1 by a heat treatment applied in a later step to form impurity-diffused region 8 for contact.

Figure 2:
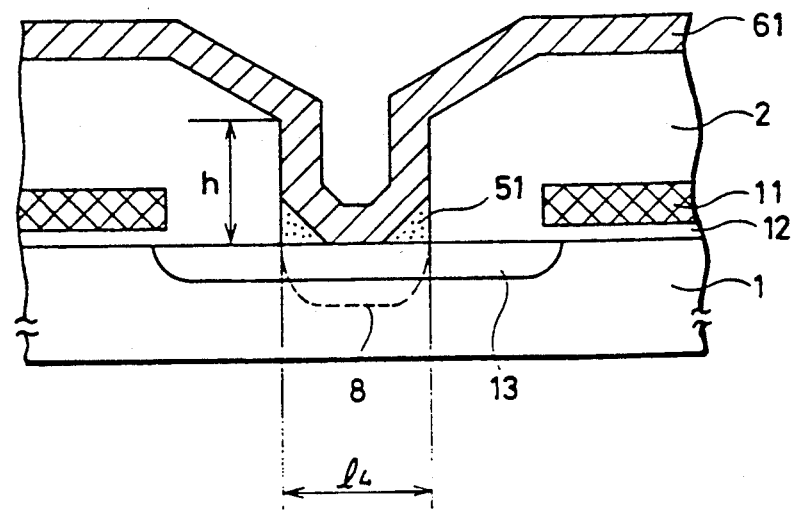
FIG. 2 is a fragmentary sectional view showing another embodiment of the contact structure for interconnection in semiconductor devices according to the present invention.
Figure 3A:
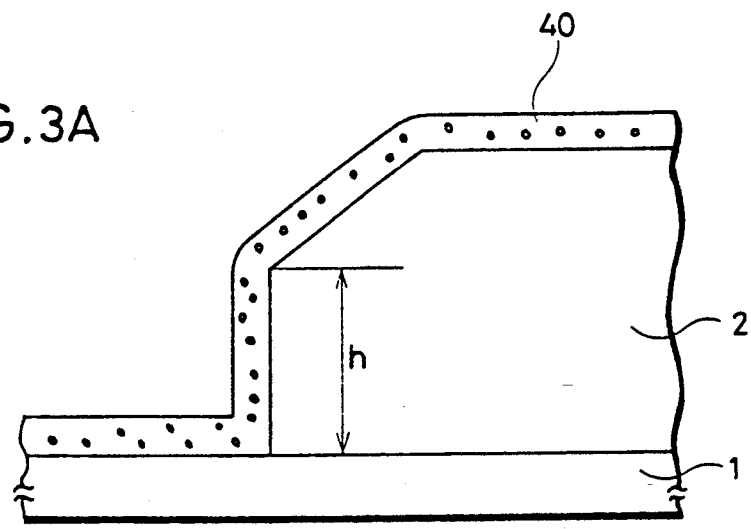
FIGS. 3A, 3B, 3C and 3D are fragmentary sectional views showing the steps of etching for forming a sidewall layer of polycrystalline silicon in a manufacturing process of the contact structure for interconnection according to the present invention.
Figure 3B:
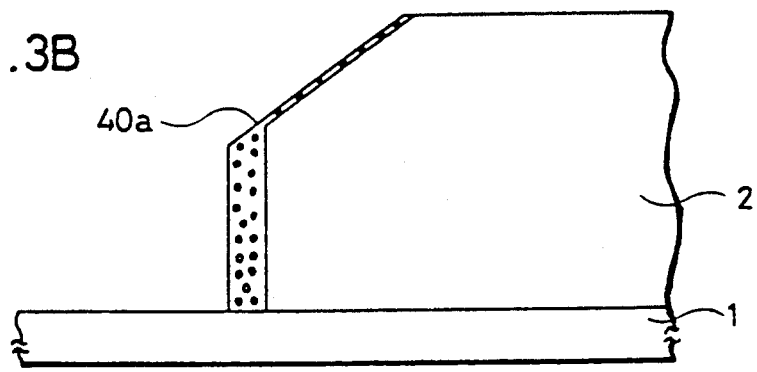
Figure 3C:
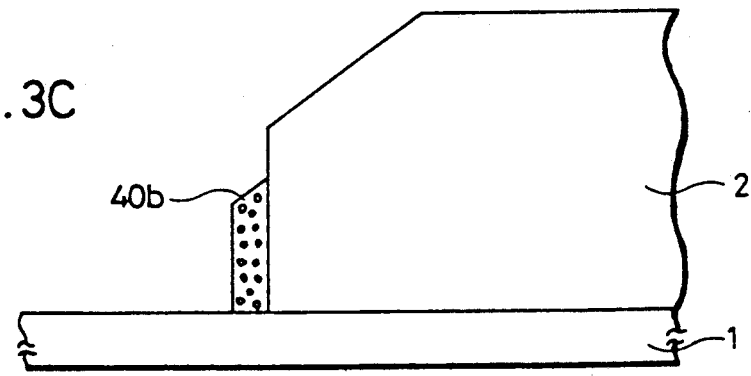
Figure 3D:
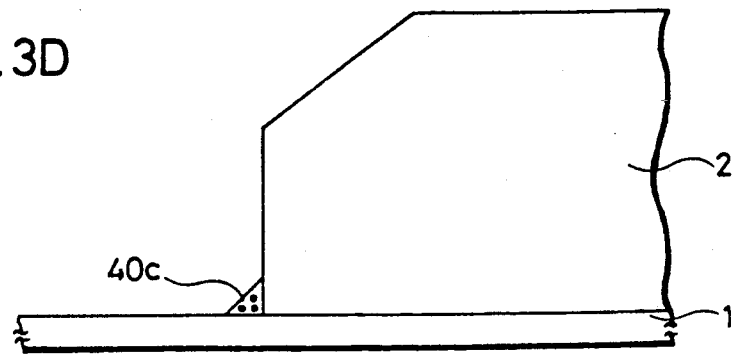

Further, while in the embodiment above, the sidewall layer of polycrystalline silicon is formed on the bottom peripheral edge of the contact hole, the sidewall layer is not limited to polycrystalline silicon if only it has a higher selectivity relative to that of insulating oxide film 2 in the overall etching. As shown in FIG. 2, for example, an insulating sidewall film 51 such as silicon oxide film and silicon nitride film may be formed between polycrystalline silicon film 61 containing impurities and impurity-diffused region 13. Also in such a structure, the interconnection layer can be formed such that the distance t2 is larger than the distance t1.

Figure 6:
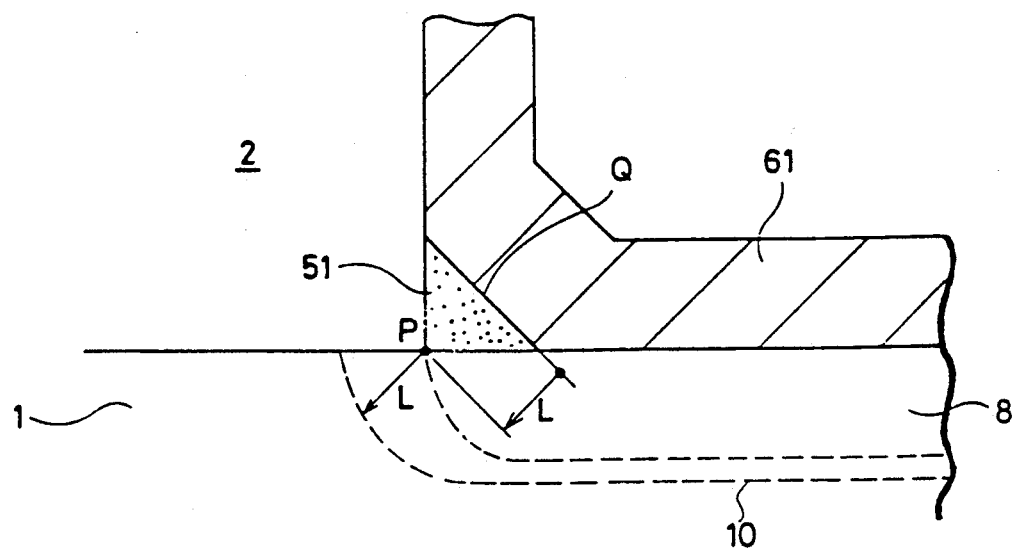
FIG. 6 is an enlarged sectional view schematically showing diffusion of impurities in a case that polycrystalline silicon containing impurities is used as a material of the interconnection layer.

FIG. 6 is a sectional view showing an enlarged sectional view of a bottom peripheral portion of the contact hole shown in FIG. 2. Referring to the diagram, in the contact structure for interconnection according to the present invention, the diffusion of impurities starts from a position Q on interface between sidewall insulating film 51 and polycrystalline silicon film 61 serving as interconnection layer, while in the conventional contact structure for interconnection, it starts from a point P on the peripheral edge of a contact hole. Therefore, even when the impurities are thermally diffused only within a length L, impurity-diffused region 8 for contact is formed and lateral diffusion of the impurities in silicon substrate 1 does not occur in the present invention. On the other hand, in the conventional structure, the impurities are thermally diffused within the length L from the point P, impurity-diffused region 10 is formed to laterally extend in silicon substrate 1.

Subsequently, description will be made on an example where the contact structure for interconnection according to the present invention is applied to a dynamic random access memory (DRAM) having a capacitor for electric charge storage. Referring to FIG. 4, a p-type impurity-diffused region 15 for preventing inversion and a thick isolating oxide film 14 are formed by thermally oxidizing a p-type silicon substrate 1 which has had p-type impurity ions selectively implanted therein. N-type impurity ions are then implanted in the silicon substrate by ion implantation method and the like, and a heat treatment is applied thereto to form an n-type impurity-diffused region 16. Subsequently, a thin capacitor gate insulating film 17 is formed by thermal oxidation or CVD method. A polycrystalline silicon layer containing impurities of a predetermined conductivity-type is deposited on this capacitor gate insulating film 17 by CVD method or the like, and selectively removed by photolithography to form a cell plate 18. In this manner, a capacitor constituted of n-type impurity-diffused region 16 and cell plate 18 is formed. This capacitor is connected to an MOS transistor. The MOS transistor comprises a gate electrode 11 as a word line and n-type impurity-diffused regions 13 as a pair of source/drain regions. The gate electrode 11 is formed on gate oxide film 12. One of the impurity-diffused regions 13 is connected to a bit line. The bit line is comprised of a polycrystalline silicon film 61 containing impurities and a silicide film 62 of a high melting point metal. Electrical contact between the bit line and the impurity-diffused region 13 is made through an impurity-diffused region 8 formed beneath the bottom of a contact hole 3. In this manner, the contact structure for interconnection according to the present invention can be applied to the dynamic random access memory, one of the semiconductor memory devices. Meanwhile, the semiconductor memory device shown in FIG. 4 has a planar capacitor structure.

Figure 5:
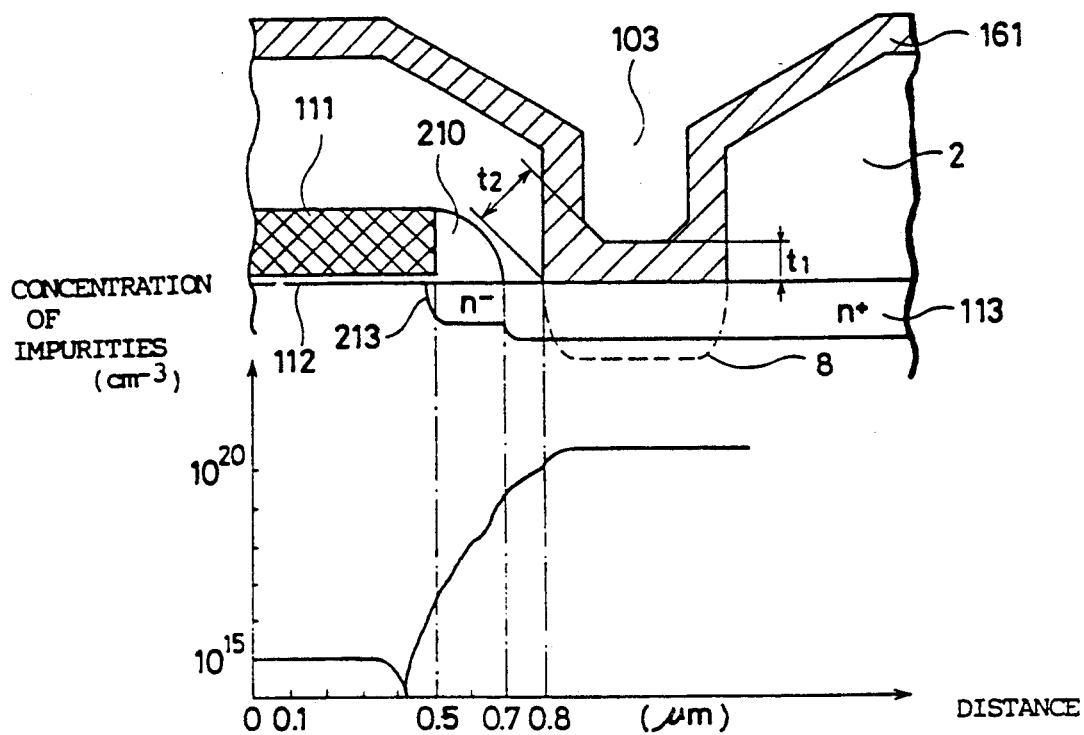
FIG. 5 is a sectional view showing an embodiment of the contact structure for interconnection according to the present invention and a diagram showing distribution of impurity concentrations corresponding to the sectional view.
Figure 12:
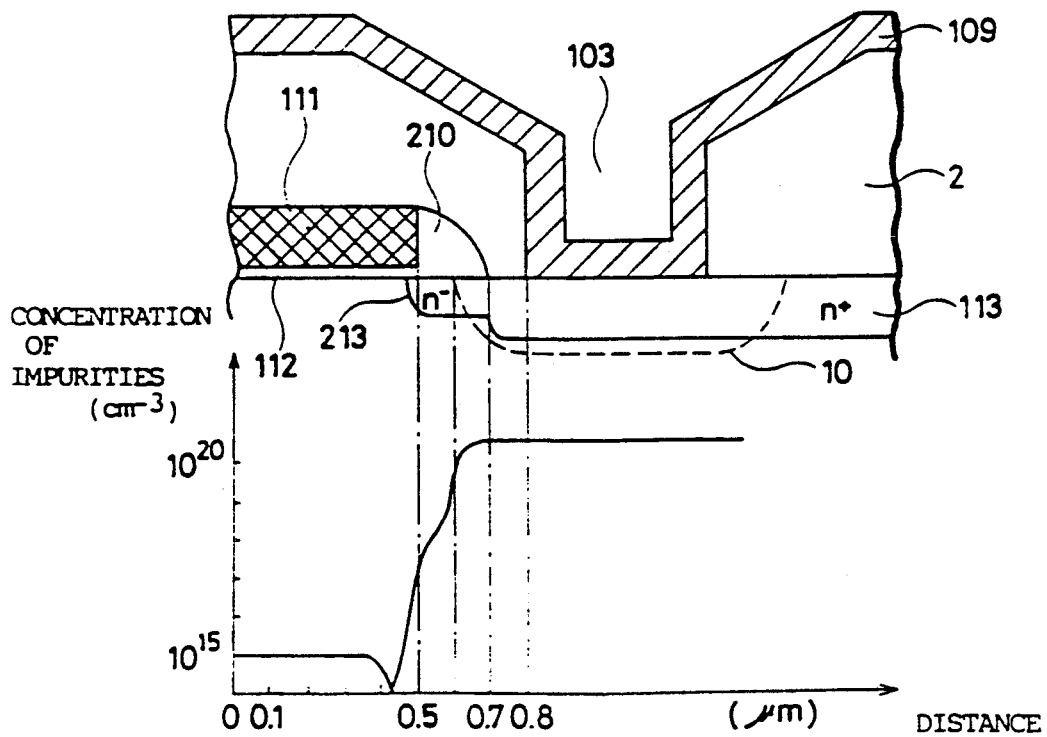
FIG. 12 is a sectional view showing a conventional contact structure for interconnection, and a diagram showing distribution of impurity concentrations corresponding to the sectional view in a case that errors have occurred in the patterning.
Figure 11:
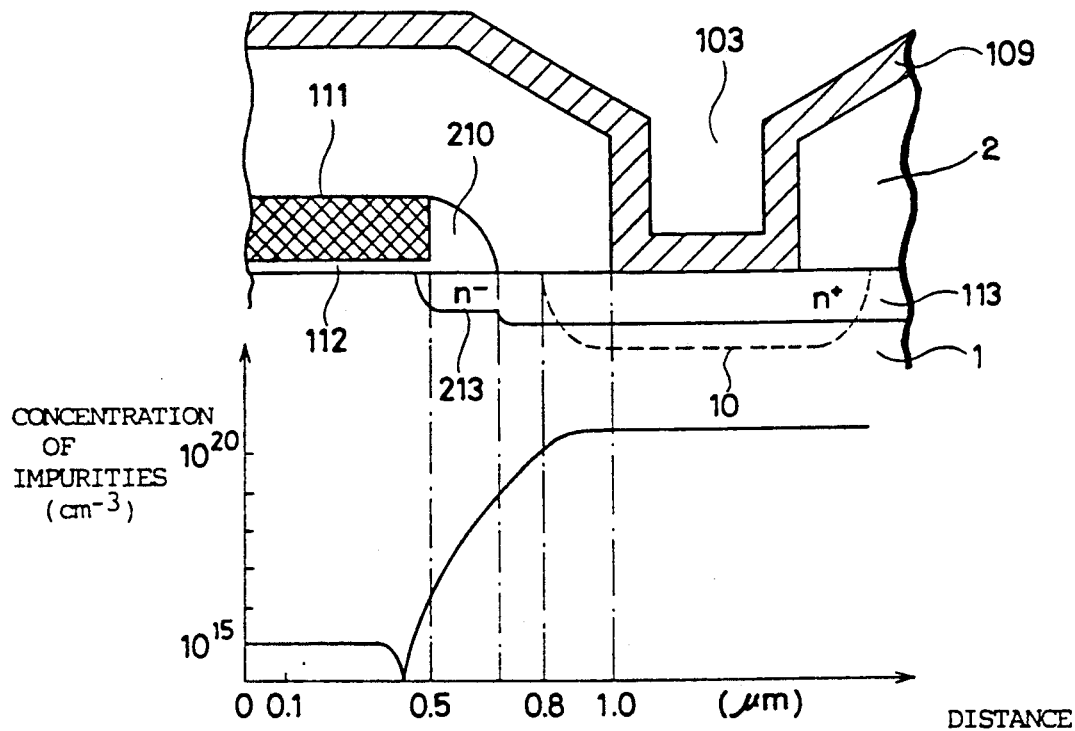
FIG. 11 is a sectional view showing a conventional contact structure for interconnection, and a diagram showing distribution of impurity concentrations corresponding to the sectional view in a case that no error has occurred in the patterning.

FIG. 5 is a fragmentary sectional view of an MOS transistor of LDD structure to which the contact structure for interconnection of the present invention is applied, and a diagram showing distribution of impurity concentrations corresponding to the sectional view. FIG. 5 show a case that errors have occurred in the patterning for making contact holes, as a comparison to the conventional structure for interconnection shown in FIG. 12. A polycrystalline silicon film 161 containing impurities is formed according to the process shown in FIGS. 1A to 1E. The distribution of impurity concentrations shown in FIG. 5 is not adversely affected and caused to change by the existence of impurity-diffused region 8, as compared with that in FIG. 12. In other words, such a sharp change of impurity concentrations as can be seen in FIG. 12 due to the existence of impurity-diffused region 10 does not appear, but a slow change of impurity concentrations can be maintained. Accordingly, the existence of an impurity-diffused region for contact can not prevent the LDD structure of the MOS transistor from reducing field strength. Further, when a comparison is made between the distributions of impurity concentrations shown in FIGS. 5 and 11, it is understood that the same distribution of impurity concentrations as that in a conventional contact structure for interconnection having no error in the patterning can be obtained. This indicates that according to the contact structure for interconnection of the present invention, the distribution of impurity concentrations remains unchanged irrespective of presence or absence of errors in the patterning.

Figure 7:
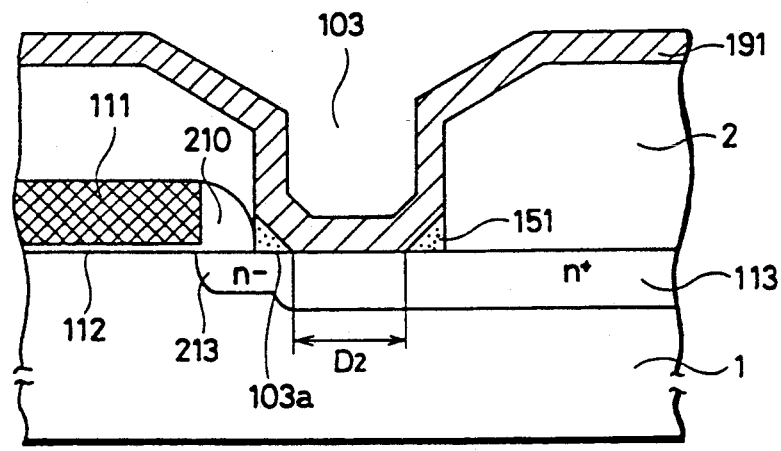
FIG. 7 is a fragmentary sectional view showing an embodiment of the contact structure for interconnection in a case that a high melting point metal is used as a material of the interconnection layer.
Figure 13:
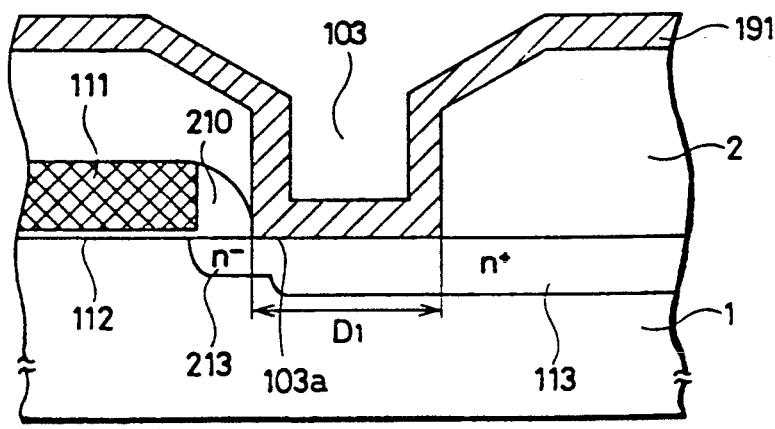
FIG. 13 is a fragmentary sectional view showing a conventional contact structure for an interconnection layer of high melting point metal in a case that errors have occurred in the patterning.

Meanwhile, a case where a material containing a high melting point metal such as tungsten and titanium is comprised in the interconnection layer will be described below. FIG. 7 is a fragmentary sectional view showing a contact structure for a high melting point metal interconnection where errors have occurred in the patterning for forming contact holes. As in the structure shown in FIG. 13, an MOS transistor has the LDD structure. A high melting point metal layer 191 containing titanium, tungsten or the like is formed to get contact with an impurity-diffused region 113 of a high concentration through a contact hole 103. Unlike the structure shown in FIG. 13, however, high melting point metal layer 191 is formed not to directly contact an impurity-diffused region 213 of a low concentration on a surface 103a of silicon substrate 1 due to the presence of a sidewall insulating layer 151. Therefore, the silicidization between the high melting point metal comprised in layer 191 and silicon substrate 1 becomes less likely to occur aound the bottom periphery of contact hole 103. Thus, problems such as an increase in electrical resistance of the contact portion and breakdown of a junction become less likely to arise. In other words, the existence of sidewall insulating layer 151 reduces diameter of the contact portion between high melting point metal layer 191 and silicon substrate 1 from D1 (FIG. 13) to D2 (FIG. 7). Accordingly, high melting point metal layer 191 is prevented from contacting impurity-diffused region 213 of a low concentration.

Figure 8:
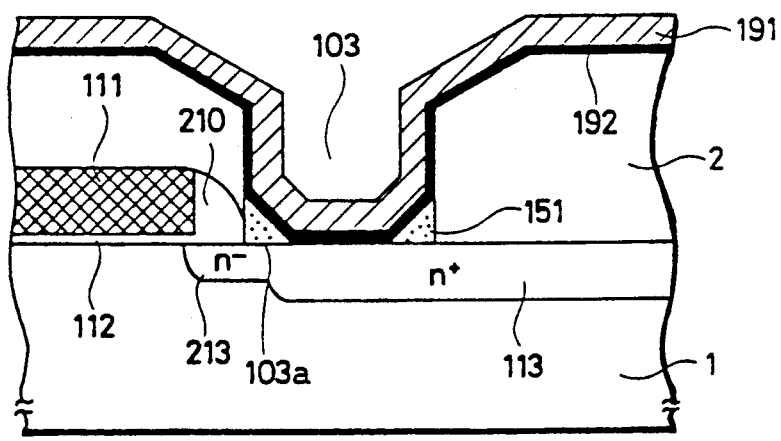
FIG. 8 is a fragmentary sectional view showing an embodiment of the contact structure for interconnection in a case that the interconnection layer is comprised of a high melting point metal layer and a barrier metal layer.

FIG. 8 is a fragmentary sectional view showing a contact structure for interconnection where the high melting point metal interconnection layer is constituted of two layers. The interconnection layer comprises a high melting point metal layer 191 and a barrier metal layer 192 formed of a compound of a high melting point metal such as Tin. In this case, barrier metal layer 192 is formed to restrain interaction between high melting point metal layer 191 and silicon substrate 1. However, there is a possibility that silicidization as described above may occur also between barrier metal layer 192 and silicon substrate 1. Therefore, the silicidization which might occur also between barrier metal layer 192 and silicon substrate 1 is restrained at a surface 103a around the bottom peripheral edge of contact hole 103 by the presence of sidewall insulating layer 151. Accordingly, problems such as an increase in electrical resistance of the contact portion and breakdown of a junction become less likely to occur.

While in the embodiment above, description has been made on an example where the contact structure for interconnection of the present invention is applied to a dynamic random access memory having a planar capacitor structure, the same can be also applied to a DRAM of a stacked capacitor structure. Further, the contact structure for interconnection of the present invention is applied not only to the semiconductor memory devices but also to any other semiconductor devices that have a structure for providing electrical contact between the interconnection layer and a conductive region formed in the semiconductor substrate through a contact hole.

As has been described above, according to the present invention, lateral extension of the interaction between the interconnection layer comprising a high melting point material as a main material and a conductive region formed in the semiconductor substrate can be restrained. Therefore, when the interconnection layer is formed of a polycrystalline silicon containing impurities, thermal diffusion of the impurities can be controlled not to extend laterally outside a contact hole. Thus, the size of an impurity-diffused region, which is formed in the semiconductor substrate to provide electrical contact between the interconnection layer formed of polycrystalline silicon and a conductive region, can be controlled such that it does not become larger than that of a contact hole. Further, when the interconnection layer is formed of a metal layer containing a high melting point metal, lateral extension of the interaction between the high melting point metal contained in the interconnection layer and a conductive region in the semiconductor substrate can be restrained.

Accordingly, even when errors have occurred in the patterning for forming contact holes, lateral extension of the interaction between the interconnection layer and a conductive region can be restrained. Therefore, characteristics of semiconductor devices such as transistor can be effectively prevented from being affected by the interconnection layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A contact structure for interconnection in FET devices, comprising:
    a semiconductor substrate having a main surface;
    a conductive region formed in said semiconductor substrate;
    an insulating layer formed on the main surface of said semiconductor substrate and having a contact hole formed therethrough to reach a surface of said conductive region;
    a gate electrode formed within said insulating layer;
    an interconnection layer formed on the surface of said conductive region and over said insulating layer and comprising a high melting point material as a main material; and
    means for restraining an impurity diffusion region caused by interaction between said interconnection layer and said conductive region from extending laterally from said contact hole into said semiconductor substrate, said means for restraining having a higher resistivity to interaction with said conductive region than said interconnection layer, being formed as a distinct structure from said interconnection layer and being arranged on said conductive region between said interconnection layer and said conductive region entirely within said contact hole as defined by said insulating layer.

2. The contact structure for interconnection according to claim 1, wherein
    said means for restraining interaction comprises an electrically insulating material.

3. The contact structure for interconnection according to claim 1, wherein
    said interconnection layer contains at least silicon and impurities of a predetermined conductivity-type.

4. The contact structure for interconnection according to claim 3, wherein
    said means for restraining interaction includes said interconnection layer which is formed with a path length from an upper surface of said interconnection layer for lateral diffusion of said impurities into said semiconductor substrate that is smaller than a path length for vertical diffusion of said impurities into said semiconductor substrate.

5. The contact structure for interconnection according to claim 1, wherein
    said interconnection layer includes a high melting point metal layer.

6. The contact structure for interconnection according to claim 1, wherein
    said means for restraining interaction is arranged around the peripheral edge of said contact hole.

7. The contact structure for interconnection according to claim 1, wherein
    said conductive region includes an impurity-diffused region of a low concentration and an impurity-diffused region of a high concentration.

8. The contact structure for interconnection according to claim 7, wherein
    said means for restraining interaction restrains interaction between said interconnection layer and said impurity-diffused region of a low concentration.

9. The contact structure for interconnection according to claim 1, wherein
    said means for restraining is formed of a conductive material and bonded to said interconnection layer.

10. The contact structure for interconnection according to claim 1, wherein said means for restraining is formed of an insulating material.

11. The contact structure for interconnection according to claim 3, wherein
said interconnection layer includes a polycrystalline silicon layer containing impurities of a predetermined conductivity-type.

12. The contact structure for interconnection according to claim 11, wherein
said interconnection layer includes a high melting point metal silicide layer formed on said polycrystalline silicon layer.

13. A manufacturing method of a contact structure for interconnection in semiconductor devices, comprising the steps of:
forming a conductive region in a semiconductor substrate;
forming a gate electrode;
forming an insulating layer on a main surface of said semiconductor substrate and over said gate electrode to have a contact hole formed through the insulating layer to reach a surface of said conductive region;
forming means for restraining a diffusion region resulting from interaction between said interconnection layer and said conductive region from extending laterally from said contact hole into said semiconductor substrate as a spacer over at least one intersection of said conductive region and a sidewall of said contact hole entirely within said contact hole;
forming an interconnection layer containing a high melting point material as a main material on the surface of said conductive region, said spacer and said insulating layer, said interconnection layer having a lower resistivity to interaction with said conductive region than said spacer; and
implanting ions into said interconnection layer to form a dispersion layer beneath said conductive region so that impurity concentration is higher in said interconnection layer than in said means for restraining and said dispersion layer is maintained without lateral expansion beyond said contact hole.

14. The manufacturing method of a contact structure for interconnection according to claim 13, wherein
the step of forming said interconnection layer includes the step of forming a layer which contains at least silicon and impurities of a predetermined conductivity-type.

15. The manufacturing method of a contact structure for interconnection according to claim 13, wherein
the step of forming said interconnection layer includes the step of forming a high melting point metal layer.

16. The manufacturing method of a contact structure for interconnection according to claim 13, wherein
the step of forming said means for restraining interaction includes the step of forming a sidewall layer on the bottom peripheral edge of said contact hole.

17. The manufacturing method of a contact structure for interconnection according to claim 16, wherein
the step of forming said sidewall layer includes the step of forming a sidewall layer of a conductive material.

18. The manufacturing method of a contact structure for interconnection according to claim 16, wherein
the step of forming said sidewall layer includes the step of forming a sidewall layer of an insulating material.

19. The manufacturing method of a contact structure for interconnection according to claim 16, wherein
the step of forming said sidewall layer includes the steps of:
forming a deposited layer containing at least silicon on the surface of said conductive region and over said insulating layer; and
leaving part of said deposited layer on the bottom peripheral edge of said contact hole by removing the rest of said deposited layer by anisotropic etching.

20. The manufacturing method of a contact structure for interconnection according to claim 19, wherein
the step of forming said interconnection layer includes the steps of:
forming a deposited layer containing at least silicon on the surface of said conductive region and over said insulating layer to cover said sidewall layer; and
thermally diffusing impurities of a predetermined conductivity-type into said deposited layer and said sidewall layer.

21. The manufacturing method of a contact structure for interconnection according to claim 19, wherein
the step of forming said interconnection layer includes the steps of:
forming a deposited layer containing at least silicon and impurities of a predetermined conductivity-type on the surface of said conductive region and over said insulating layer to cover said sidewall layer; and
thermally diffusing the impurities of a predetermined conductivity-type from said deposited layer into said sidewall layer and said conductive region.

22. The manufacturing method of a contact structure for interconnection according to claim 16, wherein
the step of forming said sidewall layer includes the steps of:
forming a deposited layer of an insulating material on the surface of said conductive region and over said insulating layer; and
leaving part of said deposited layer on the bottom periphery edge of said contact hole by removing the rest of said deposited layer by anisotropic etching.

23. An FET device comprising:
a semiconductor substrate having a main surface and a conductive region formed on said main surface;
an insulating layer formed on said main surface and having a contact hole formed therethrough to reach a surface of said conductive region;
a gate electrode formed within said insulating layer;
at least two spacers, each formed on said conducting region at an intersection of the surface of said conductive region and a side surface of said contact hole, each said spacer having a triangular cross section; and
an interconnection layer electrically connected to the exposed surface of said conductive region and contiguously formed over the spacers, the surface of the conductive region and the surface of said insulating layer, said interconnection layer being polycrystalline silicon having an impurity concentration greater than that of said spacers, wherein
said spacers restrain lateral impurity migration due to interaction of said interconnection layer and said conductive region in said contact hole from extending into other portions of said substrate.

* * * * *